(12) United States Patent
Resch

(10) Patent No.: US 10,042,566 B2
(45) Date of Patent: *Aug. 7, 2018

(54) INTELLIGENT READ STRATEGY WITHIN A DISPERSED STORAGE NETWORK (DSN)

(71) Applicant: International Business Machines Corporation, Armonk, NY (US)

(72) Inventor: Jason K. Resch, Chicago, IL (US)

(73) Assignee: International Business Machines Corporation, Armonk, NY (US)

(*) Notice: Subject to any disclaimer, the term of this patent is extended or adjusted under 35 U.S.C. 154(b) by 0 days.

This patent is subject to a terminal disclaimer.

(21) Appl. No.: 15/249,187

(22) Filed: Aug. 26, 2016

(65) Prior Publication Data
US 2017/0060686 A1    Mar. 2, 2017

Related U.S. Application Data

(60) Provisional application No. 62/211,975, filed on Aug. 31, 2015.

(51) Int. Cl.
G06F 3/06 (2006.01)
G06F 11/10 (2006.01)
(Continued)

(52) U.S. Cl.
CPC ............ G06F 3/0619 (2013.01); G06F 3/064 (2013.01); G06F 3/067 (2013.01); G06F 3/0611 (2013.01);
(Continued)

(58) Field of Classification Search
None
See application file for complete search history.

(56) References Cited

U.S. PATENT DOCUMENTS 4,092,732 A    5/1978  Ouchi
5,454,101 A    9/1995  MacKay et al.
(Continued)

OTHER PUBLICATIONS

Shamir; How to Share a Secret; Communications of the ACM; vol. 22, No. 11; Nov. 1979; pp. 612-613.
(Continued)

*Primary Examiner* — Mujtaba M Chaudry
(74) *Attorney, Agent, or Firm* — Garlick & Markison; Timothy W. Markison; Shayne X. Short (57) ABSTRACT

A computing device includes an interface configured to interface and communicate with a dispersed storage network (DSN), a memory that stores operational instructions, and a processing module operably coupled to the interface and memory such that the processing module, when operable within the computing device based on the operational instructions, is configured to perform various operations. For example, the computing device generates and transmits a read request for a set of encoded data slices (EDSs) of a data object to primary storage units (SUs). The data object is stored within primary and secondary SUs. The computing device then receives at least the read threshold number of EDSs from the plurality of primary SUs. The primary SUs operate selectively to provide the at least the read threshold number of EDSs to the computing device either from memory of primary SU(s) or from secondary SU(s).

20 Claims, 6 Drawing Sheets

(51) Int. Cl.
*G06F 12/14* (2006.01)
*H04L 29/08* (2006.01)
*G06F 11/30* (2006.01)
*G06F 11/34* (2006.01)
*H03M 13/15* (2006.01)

(52) U.S. Cl.
CPC .......... *G06F 3/0622* (2013.01); *G06F 3/0637* (2013.01); *G06F 3/0644* (2013.01); *G06F 3/0659* (2013.01); *G06F 3/0665* (2013.01); *G06F 3/0689* (2013.01); *G06F 11/1076* (2013.01); *G06F 11/1092* (2013.01); *G06F 11/3034* (2013.01); *G06F 11/3409* (2013.01); *G06F 12/1408* (2013.01); *H04L 67/1097* (2013.01); *G06F 2212/1052* (2013.01); *H03M 13/1515* (2013.01)

(56) References Cited

U.S. PATENT DOCUMENTS

| | | |
|---|---|---|
| 5,485,474 A | 1/1996 | Rabin |
| 5,774,643 A | 6/1998 | Lubbers et al. |
| 5,802,364 A | 9/1998 | Senator et al. |
| 5,809,285 A | 9/1998 | Hilland |
| 5,890,156 A | 3/1999 | Rekieta et al. |
| 5,987,622 A | 11/1999 | Lo Verso et al. |
| 5,991,414 A | 11/1999 | Garay et al. |
| 6,012,159 A | 1/2000 | Fischer et al. |
| 6,058,454 A | 5/2000 | Gerlach et al. |
| 6,070,003 A * | 5/2000 | Gove ............... G06F 15/17375 710/317 |
| 6,128,277 A | 10/2000 | Bruck et al. |
| 6,175,571 B1 | 1/2001 | Haddock et al. |
| 6,192,472 B1 | 2/2001 | Garay et al. |
| 6,256,688 B1 | 7/2001 | Suetaka et al. |
| 6,272,658 B1 | 8/2001 | Steele et al. |
| 6,301,604 B1 | 10/2001 | Nojima |
| 6,356,949 B1 | 3/2002 | Katsandres et al. |
| 6,366,995 B1 | 4/2002 | Vilkov et al. |
| 6,374,336 B1 | 4/2002 | Peters et al. |
| 6,415,373 B1 | 7/2002 | Peters et al. |
| 6,418,539 B1 | 7/2002 | Walker |
| 6,449,688 B1 | 9/2002 | Peters et al. |
| 6,567,948 B2 | 5/2003 | Steele et al. |
| 6,571,282 B1 | 5/2003 | Bowman-Amuah |
| 6,609,223 B1 | 8/2003 | Wolfgang |
| 6,718,361 B1 | 4/2004 | Basani et al. |
| 6,760,808 B2 | 7/2004 | Peters et al. |
| 6,785,768 B2 | 8/2004 | Peters et al. |
| 6,785,783 B2 | 8/2004 | Buckland |
| 6,826,711 B2 | 11/2004 | Moulton et al. |
| 6,879,596 B1 | 4/2005 | Dooply |
| 7,003,688 B1 | 2/2006 | Pittelkow et al. |
| 7,024,451 B2 | 4/2006 | Jorgenson |
| 7,024,609 B2 | 4/2006 | Wolfgang et al. |
| 7,080,101 B1 | 7/2006 | Watson et al. |
| 7,103,824 B2 | 9/2006 | Halford |
| 7,103,915 B2 | 9/2006 | Redlich et al. |
| 7,111,115 B2 | 9/2006 | Peters et al. |
| 7,140,044 B2 | 11/2006 | Redlich et al. |
| 7,146,644 B2 | 12/2006 | Redlich et al. |
| 7,171,493 B2 | 1/2007 | Shu et al. |
| 7,222,133 B1 | 5/2007 | Raipurkar et al. |
| 7,240,236 B2 | 7/2007 | Cutts et al. |
| 7,272,613 B2 | 9/2007 | Sim et al. |
| 7,636,724 B2 | 12/2009 | de la Torre et al. |
| 2002/0062422 A1 | 5/2002 | Butterworth et al. |
| 2002/0166079 A1 | 11/2002 | Ulrich et al. |
| 2003/0018927 A1 | 1/2003 | Gadir et al. |
| 2003/0037261 A1 | 2/2003 | Meffert et al. |
| 2003/0065617 A1 | 4/2003 | Watkins et al. |
| 2003/0084020 A1 | 5/2003 | Shu |
| 2004/0024963 A1 | 2/2004 | Talagala et al. |
| 2004/0122917 A1 | 6/2004 | Menon et al. |
| 2004/0215998 A1 | 10/2004 | Buxton et al. |
| 2004/0228493 A1 | 11/2004 | Ma |
| 2005/0100022 A1 | 5/2005 | Ramprashad |
| 2005/0114594 A1 | 5/2005 | Corbett et al. |
| 2005/0125593 A1 | 6/2005 | Karpoff et al. |
| 2005/0131993 A1 | 6/2005 | Fatula |
| 2005/0132070 A1 | 6/2005 | Redlich et al. |
| 2005/0144382 A1 | 6/2005 | Schmisseur |
| 2005/0229069 A1 | 10/2005 | Hassner et al. |
| 2006/0047907 A1 | 3/2006 | Shiga et al. |
| 2006/0136448 A1 | 6/2006 | Cialini et al. |
| 2006/0156059 A1 | 7/2006 | Kitamura |
| 2006/0224603 A1 | 10/2006 | Correll |
| 2007/0079081 A1 | 4/2007 | Gladwin et al. |
| 2007/0079082 A1 | 4/2007 | Gladwin et al. |
| 2007/0079083 A1 | 4/2007 | Gladwin et al. |
| 2007/0088970 A1 | 4/2007 | Buxton et al. |
| 2007/0174192 A1 | 7/2007 | Gladwin et al. |
| 2007/0214285 A1 | 9/2007 | Au et al. |
| 2007/0234110 A1 | 10/2007 | Soran et al. |
| 2007/0283167 A1 | 12/2007 | Venters et al. |
| 2009/0094251 A1 | 4/2009 | Gladwin et al. |
| 2009/0094318 A1 | 4/2009 | Gladwin et al. |
| 2010/0023524 A1 | 1/2010 | Gladwin et al. |
| 2011/0072210 A1 * | 3/2011 | Dhuse ............... G06F 11/1076 711/114 |
| 2012/0198066 A1 * | 8/2012 | Grube ............... H04L 67/1097 709/225 |
| 2014/0298061 A1 * | 10/2014 | Volvovski ............ G06F 3/0625 713/323 |

OTHER PUBLICATIONS

Rabin; Efficient Dispersal of Information for Security, Load Balancing, and Fault Tolerance; Journal of the Association for Computer Machinery; vol. 36, No. 2; Apr. 1989; pp. 335-348.
Chung; An Automatic Data Segmentation Method for 3D Measured Data Points; National Taiwan University; pp. 1-8; 1998.
Plank, T1: Erasure Codes for Storage Applications; FAST2005, 4th Usenix Conference on File Storage Technologies; Dec. 13-16, 2005; pp. 1-74.
Wildi; Java iSCSi Initiator; Master Thesis; Department of Computer and Information Science, University of Konstanz; Feb. 2007; 60 pgs.
Legg; Lightweight Directory Access Protocol (LDAP): Syntaxes and Matching Rules; IETF Network Working Group; RFC 4517; Jun. 2006; pp. 1-50.
Zeilenga; Lightweight Directory Access Protocol (LDAP): Internationalized String Preparation; IETF Network Working Group; RFC 4518; Jun. 2006; pp. 1-14.
Smith; Lightweight Directory Access Protocol (LDAP): Uniform Resource Locator; IETF Network Working Group; RFC 4516; Jun. 2006; pp. 1-15.
Smith; Lightweight Directory Access Protocol (LDAP): String Representation of Search Filters; IETF Network Working Group; RFC 4515; Jun. 2006; pp. 1-12.
Zeilenga; Lightweight Directory Access Protocol (LDAP): Directory Information Models; IETF Network Working Group; RFC 4512; Jun. 2006; pp. 1-49.
Sciberras; Lightweight Directory Access Protocol (LDAP): Schema for User Applications; IETF Network Working Group; RFC 4519; Jun. 2006; pp. 1-33.
Harrison; Lightweight Directory Access Protocol (LDAP): Authentication Methods and Security Mechanisms; IETF Network Working Group; RFC 4513; Jun. 2006; pp. 1-32.
Zeilenga; Lightweight Directory Access Protocol (LDAP): Technical Specification Road Map; IETF Network Working Group; RFC 4510; Jun. 2006; pp. 1-8.
Zeilenga; Lightweight Directory Access Protocol (LDAP): String Representation of Distinguished Names; IETF Network Working Group; RFC 4514; Jun. 2006; pp. 1-15.
Sermersheim; Lightweight Directory Access Protocol (LDAP): The Protocol; IETF Network Working Group; RFC 4511; Jun. 2006; pp. 1-68.

(56) References Cited

OTHER PUBLICATIONS

Satran, et al.; Internet Small Computer Systems Interface (iSCSI); IETF Network Working Group; RFC 3720; Apr. 2004; pp. 1-257.
Xin, et al.; Evaluation of Distributed Recovery in Large-Scale Storage Systems; 13th IEEE International Symposium on High Performance Distributed Computing; Jun. 2004; pp. 172-181.
Kubiatowicz, et al.; OceanStore: An Architecture for Global-Scale Persistent Storage; Proceedings of the Ninth International Conference on Architectural Support for Programming Languages and Operating Systems (ASPLOS 2000); Nov. 2000; pp. 1-12.

* cited by examiner

FIG. 8

# INTELLIGENT READ STRATEGY WITHIN A DISPERSED STORAGE NETWORK (DSN)

CROSS REFERENCE TO RELATED PATENTS

The present U.S. Utility Patent Application claims priority pursuant to 35 U.S.C. § 119(e) to U.S. Provisional Application No. 62/211,975, entitled "STORING ENCODED DATA SLICES IN A DISPERSED STORAGE NETWORK," filed Aug. 31, 2015, which is hereby incorporated herein by reference in its entirety and made part of the present U.S. Utility Patent Application for all purposes.

STATEMENT REGARDING FEDERALLY SPONSORED RESEARCH OR DEVELOPMENT

Not applicable.

INCORPORATION-BY-REFERENCE OF MATERIAL SUBMITTED ON A COMPACT DISC

Not applicable.

BACKGROUND OF THE INVENTION

Technical Field of the Invention

This invention relates generally to computer networks and more particularly to dispersing error encoded data.

Description of Related Art

Computing devices are known to communicate data, process data, and/or store data. Such computing devices range from wireless smart phones, laptops, tablets, personal computers (PC), work stations, and video game devices, to data centers that support millions of web searches, stock trades, or on-line purchases every day. In general, a computing device includes a central processing unit (CPU), a memory system, user input/output interfaces, peripheral device interfaces, and an interconnecting bus structure.

As is further known, a computer may effectively extend its CPU by using "cloud computing" to perform one or more computing functions (e.g., a service, an application, an algorithm, an arithmetic logic function, etc.) on behalf of the computer. Further, for large services, applications, and/or functions, cloud computing may be performed by multiple cloud computing resources in a distributed manner to improve the response time for completion of the service, application, and/or function. For example, Hadoop is an open source software framework that supports distributed applications enabling application execution by thousands of computers.

In addition to cloud computing, a computer may use "cloud storage" as part of its memory system. As is known, cloud storage enables a user, via its computer, to store files, applications, etc. on an Internet storage system. The Internet storage system may include a RAID (redundant array of independent disks) system and/or a dispersed storage system that uses an error correction scheme to encode data for storage.

Retrieval of stored data within data storage systems can operate sub-optimally for many reasons. For example, depending of the type of data that is stored and where the data is stored, retrieval of the data may be slowed when operation of a communication network connecting various devices of a data storage system is slowed. Moreover, when the communication network is experiences interference, noise, problems, etc. some of the data may be returned corrupted, unusable, or unrecoverable in response to a request for the data. The prior art does not provide an adequate means to deal with such situations while maintaining a high level of performance for the overall data storage system.

DETAILED DESCRIPTION OF THE INVENTION

Figure 1:
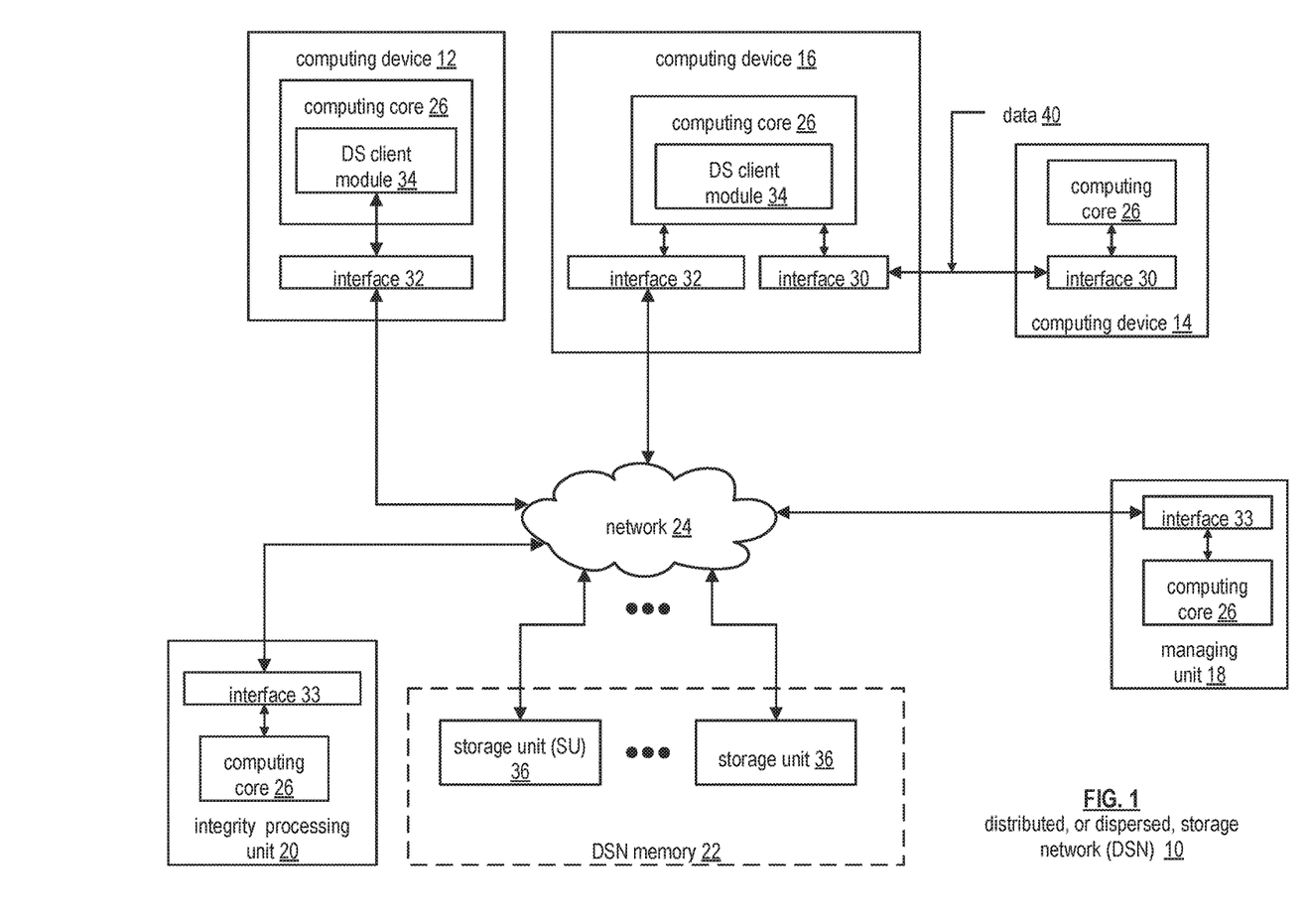
FIG. 1 is a schematic block diagram of an embodiment of a dispersed or distributed storage network (DSN) in accordance with the present invention.

FIG. 1 is a schematic block diagram of an embodiment of a dispersed, or distributed, storage network (DSN) 10 that includes a plurality of computing devices 12-16, a managing unit 18, an integrity processing unit 20, and a DSN memory 22. The components of the DSN 10 are coupled to a network 24, which may include one or more wireless and/or wire lined communication systems; one or more non-public intranet systems and/or public internet systems; and/or one or more local area networks (LAN) and/or wide area networks (WAN).

Figure 2:
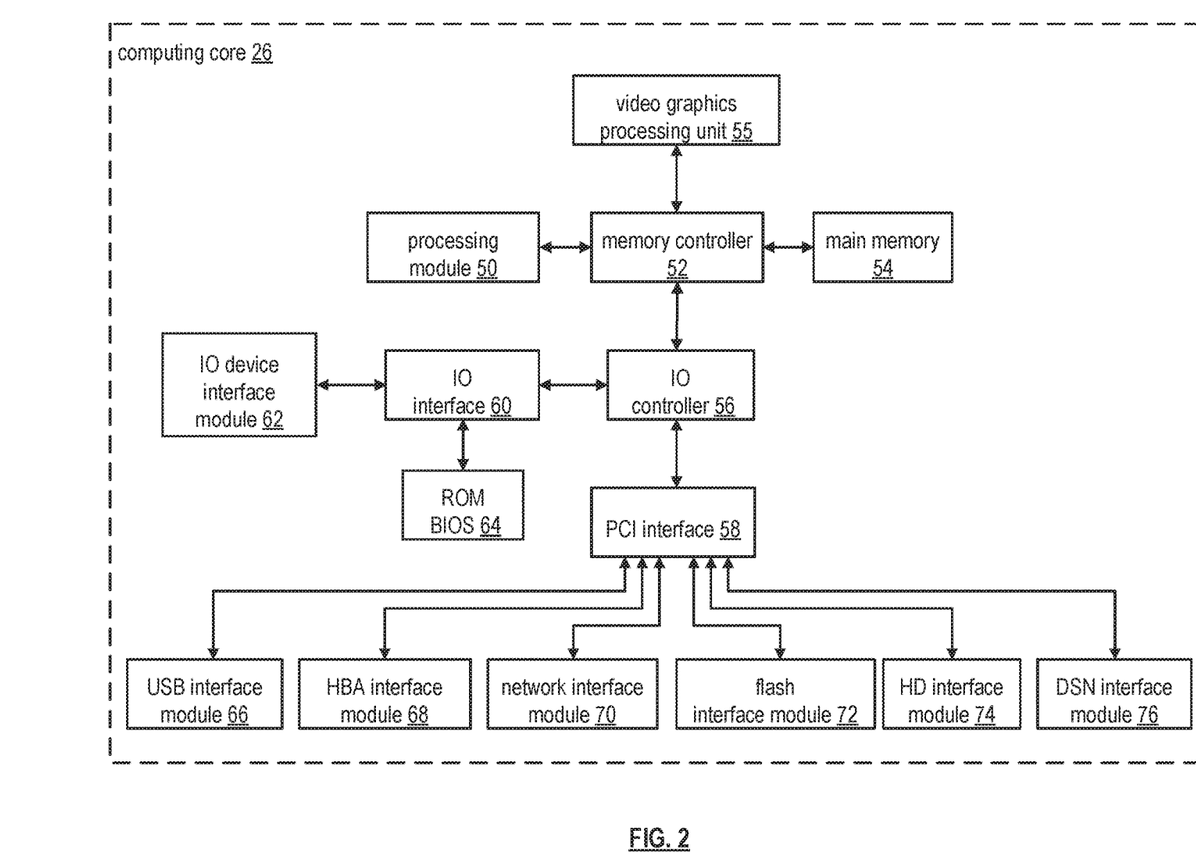
FIG. 2 is a schematic block diagram of an embodiment of a computing core in accordance with the present invention.

The DSN memory 22 includes a plurality of storage units 36 that may be located at geographically different sites (e.g., one in Chicago, one in Milwaukee, etc.), at a common site, or a combination thereof. For example, if the DSN memory 22 includes eight storage units 36, each storage unit is located at a different site. As another example, if the DSN memory 22 includes eight storage units 36, all eight storage units are located at the same site. As yet another example, if the DSN memory 22 includes eight storage units 36, a first pair of storage units are at a first common site, a second pair of storage units are at a second common site, a third pair of storage units are at a third common site, and a fourth pair of storage units are at a fourth common site. Note that a DSN memory 22 may include more or less than eight storage units 36. Further note that each storage unit 36 includes a computing core (as shown in FIG. 2, or components thereof) and a plurality of memory devices for storing dispersed error encoded data.

Each of the computing devices 12-16, the managing unit 18, and the integrity processing unit 20 include a computing core 26, which includes network interfaces 30-33. Computing devices 12-16 may each be a portable computing device and/or a fixed computing device. A portable computing device may be a social networking device, a gaming device, a cell phone, a smart phone, a digital assistant, a digital music player, a digital video player, a laptop computer, a handheld computer, a tablet, a video game controller, and/or any other portable device that includes a computing core. A fixed computing device may be a computer (PC), a computer server, a cable set-top box, a satellite receiver, a television set, a printer, a fax machine, home entertainment equipment, a video game console, and/or any type of home or office computing equipment. Note that each of the managing unit 18 and the integrity processing unit 20 may be separate computing devices, may be a common computing device, and/or may be integrated into one or more of the computing devices 12-16 and/or into one or more of the storage units 36.

Each interface 30, 32, and 33 includes software and hardware to support one or more communication links via the network 24 indirectly and/or directly. For example, interface 30 supports a communication link (e.g., wired, wireless, direct, via a LAN, via the network 24, etc.) between computing devices 14 and 16. As another example, interface 32 supports communication links (e.g., a wired connection, a wireless connection, a LAN connection, and/or any other type of connection to/from the network 24) between computing devices 12 & 16 and the DSN memory 22. As yet another example, interface 33 supports a communication link for each of the managing unit 18 and the integrity processing unit 20 to the network 24.

Computing devices 12 and 16 include a dispersed storage (DS) client module 34, which enables the computing device to dispersed storage error encode and decode data as subsequently described with reference to one or more of FIGS. 3-8. In this example embodiment, computing device 16 functions as a dispersed storage processing agent for computing device 14. In this role, computing device 16 dispersed storage error encodes and decodes data on behalf of computing device 14. With the use of dispersed storage error encoding and decoding, the DSN 10 is tolerant of a significant number of storage unit failures (the number of failures is based on parameters of the dispersed storage error encoding function) without loss of data and without the need for a redundant or backup copies of the data. Further, the DSN 10 stores data for an indefinite period of time without data loss and in a secure manner (e.g., the system is very resistant to unauthorized attempts at accessing the data).

In operation, the managing unit 18 performs DS management services. For example, the managing unit 18 establishes distributed data storage parameters (e.g., vault creation, distributed storage parameters, security parameters, billing information, user profile information, etc.) for computing devices 12-14 individually or as part of a group of user devices. As a specific example, the managing unit 18 coordinates creation of a vault (e.g., a virtual memory block associated with a portion of an overall namespace of the DSN) within the DSN memory 22 for a user device, a group of devices, or for public access and establishes per vault dispersed storage (DS) error encoding parameters for a vault. The managing unit 18 facilitates storage of DS error encoding parameters for each vault by updating registry information of the DSN 10, where the registry information may be stored in the DSN memory 22, a computing device 12-16, the managing unit 18, and/or the integrity processing unit 20.

The DSN managing unit 18 creates and stores user profile information (e.g., an access control list (ACL)) in local memory and/or within memory of the DSN module 22. The user profile information includes authentication information, permissions, and/or the security parameters. The security parameters may include encryption/decryption scheme, one or more encryption keys, key generation scheme, and/or data encoding/decoding scheme.

The DSN managing unit 18 creates billing information for a particular user, a user group, a vault access, public vault access, etc. For instance, the DSN managing unit 18 tracks the number of times a user accesses a non-public vault and/or public vaults, which can be used to generate a per-access billing information. In another instance, the DSN managing unit 18 tracks the amount of data stored and/or retrieved by a user device and/or a user group, which can be used to generate a per-data-amount billing information.

As another example, the managing unit 18 performs network operations, network administration, and/or network maintenance. Network operations includes authenticating user data allocation requests (e.g., read and/or write requests), managing creation of vaults, establishing authentication credentials for user devices, adding/deleting components (e.g., user devices, storage units, and/or computing devices with a DS client module 34) to/from the DSN 10, and/or establishing authentication credentials for the storage units 36. Network administration includes monitoring devices and/or units for failures, maintaining vault information, determining device and/or unit activation status, determining device and/or unit loading, and/or determining any other system level operation that affects the performance level of the DSN 10. Network maintenance includes facilitating replacing, upgrading, repairing, and/or expanding a device and/or unit of the DSN 10.

The integrity processing unit 20 performs rebuilding of 'bad' or missing encoded data slices. At a high level, the integrity processing unit 20 performs rebuilding by periodically attempting to retrieve/list encoded data slices, and/or slice names of the encoded data slices, from the DSN memory 22. For retrieved encoded slices, they are checked for errors due to data corruption, outdated version, etc. If a slice includes an error, it is flagged as a 'bad' slice. For encoded data slices that were not received and/or not listed, they are flagged as missing slices. Bad and/or missing slices are subsequently rebuilt using other retrieved encoded data slices that are deemed to be good slices to produce rebuilt slices. The rebuilt slices are stored in the DSN memory 22.

FIG. 2 is a schematic block diagram of an embodiment of a computing core 26 that includes a processing module 50, a memory controller 52, main memory 54, a video graphics processing unit 55, an input/output (IO) controller 56, a peripheral component interconnect (PCI) interface 58, an IO interface module 60, at least one IO device interface module 62, a read only memory (ROM) basic input output system (BIOS) 64, and one or more memory interface modules. The one or more memory interface module(s) includes one or more of a universal serial bus (USB) interface module 66, a host bus adapter (HBA) interface module 68, a network interface module 70, a flash interface module 72, a hard drive interface module 74, and a DSN interface module 76.

The DSN interface module 76 functions to mimic a conventional operating system (OS) file system interface (e.g., network file system (NFS), flash file system (FFS), disk file system (DFS), file transfer protocol (FTP), web-based distributed authoring and versioning (WebDAV), etc.) and/or a block memory interface (e.g., small computer system interface (SCSI), internet small computer system interface (iSCSI), etc.). The DSN interface module 76 and/or the network interface module 70 may function as one or more of the interface 30-33 of FIG. 1. Note that the IO device interface module 62 and/or the memory interface modules 66-76 may be collectively or individually referred to as IO ports.

Figures 3, 4:
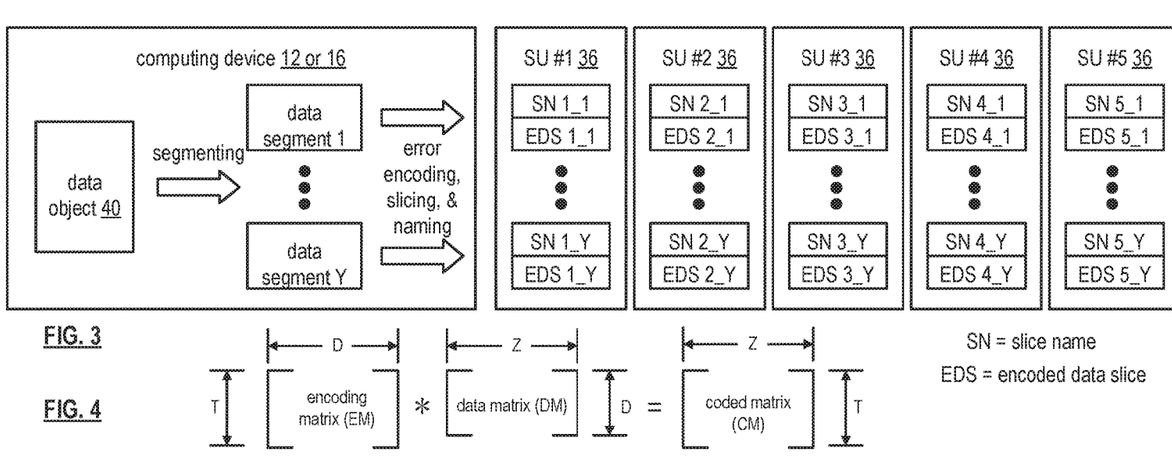
FIG. 3 is a schematic block diagram of an example of dispersed storage error encoding of data in accordance with the present invention.
FIG. 4 is a schematic block diagram of a generic example of an error encoding function in accordance with the present invention.

FIG. 3 is a schematic block diagram of an example of dispersed storage error encoding of data. When a computing device 12 or 16 has data to store it disperse storage error encodes the data in accordance with a dispersed storage error encoding process based on dispersed storage error encoding parameters. The dispersed storage error encoding parameters include an encoding function (e.g., information dispersal algorithm, Reed-Solomon, Cauchy Reed-Solomon, systematic encoding, non-systematic encoding, on-line codes, etc.), a data segmenting protocol (e.g., data segment size, fixed, variable, etc.), and per data segment encoding values. The per data segment encoding values include a total, or pillar width, number (T) of encoded data slices per encoding of a data segment i.e., in a set of encoded data slices); a decode threshold number (D) of encoded data slices of a set of encoded data slices that are needed to recover the data segment; a read threshold number (R) of encoded data slices to indicate a number of encoded data slices per set to be read from storage for decoding of the data segment; and/or a write threshold number (W) to indicate a number of encoded data slices per set that must be accurately stored before the encoded data segment is deemed to have been properly stored. The dispersed storage error encoding parameters may further include slicing information (e.g., the number of encoded data slices that will be created for each data segment) and/or slice security information (e.g., per encoded data slice encryption, compression, integrity checksum, etc.).

Figures 5, 6:
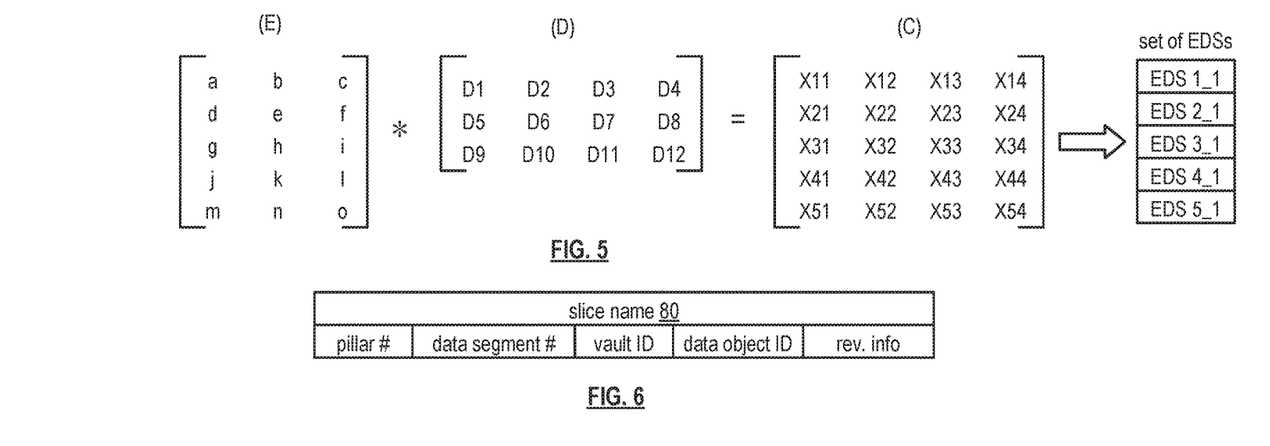
FIG. 5 is a schematic block diagram of a specific example of an error encoding function in accordance with the present invention.
FIG. 6 is a schematic block diagram of an example of a slice name of an encoded data slice (EDS) in accordance with the present invention.

In the present example, Cauchy Reed-Solomon has been selected as the encoding function (a generic example is shown in FIG. 4 and a specific example is shown in FIG. 5); the data segmenting protocol is to divide the data object into fixed sized data segments; and the per data segment encoding values include: a pillar width of 5, a decode threshold of 3, a read threshold of 4, and a write threshold of 4. In accordance with the data segmenting protocol, the computing device 12 or 16 divides the data (e.g., a file (e.g., text, video, audio, etc.), a data object, or other data arrangement) into a plurality of fixed sized data segments (e.g., 1 through Y of a fixed size in range of Kilo-bytes to Tera-bytes or more). The number of data segments created is dependent of the size of the data and the data segmenting protocol.

The computing device 12 or 16 then disperse storage error encodes a data segment using the selected encoding function (e.g., Cauchy Reed-Solomon) to produce a set of encoded data slices. FIG. 4 illustrates a generic Cauchy Reed-Solomon encoding function, which includes an encoding matrix (EM), a data matrix (DM), and a coded matrix (CM). The size of the encoding matrix (EM) is dependent on the pillar width number (T) and the decode threshold number (D) of selected per data segment encoding values. To produce the data matrix (DM), the data segment is divided into a plurality of data blocks and the data blocks are arranged into D number of rows with Z data blocks per row. Note that Z is a function of the number of data blocks created from the data segment and the decode threshold number (D). The coded matrix is produced by matrix multiplying the data matrix by the encoding matrix.

FIG. 5 illustrates a specific example of Cauchy Reed-Solomon encoding with a pillar number (T) of five and decode threshold number of three. In this example, a first data segment is divided into twelve data blocks (D1-D12). The coded matrix includes five rows of coded data blocks, where the first row of X11-X14 corresponds to a first encoded data slice (EDS 1_1), the second row of X21-X24 corresponds to a second encoded data slice (EDS 2_1), the third row of X31-X34 corresponds to a third encoded data slice (EDS 3_1), the fourth row of X41-X44 corresponds to a fourth encoded data slice (EDS 4_1), and the fifth row of X51-X54 corresponds to a fifth encoded data slice (EDS 5_1). Note that the second number of the EDS designation corresponds to the data segment number.

Returning to the discussion of FIG. 3, the computing device also creates a slice name (SN) for each encoded data slice (EDS) in the set of encoded data slices. A typical format for a slice name 60 is shown in FIG. 6. As shown, the slice name (SN) 60 includes a pillar number of the encoded data slice (e.g., one of 1-T), a data segment number (e.g., one of 1-Y), a vault identifier (ID), a data object identifier (ID), and may further include revision level information of the encoded data slices. The slice name functions as, at least part of, a DSN address for the encoded data slice for storage and retrieval from the DSN memory 22.

As a result of encoding, the computing device 12 or 16 produces a plurality of sets of encoded data slices, which are provided with their respective slice names to the storage units for storage. As shown, the first set of encoded data slices includes EDS 1_1 through EDS 5_1 and the first set of slice names includes SN 1_1 through SN 5_1 and the last set of encoded data slices includes EDS 1_Y through EDS 5_Y and the last set of slice names includes SN 1_Y through SN 5_Y.

Figure 7:
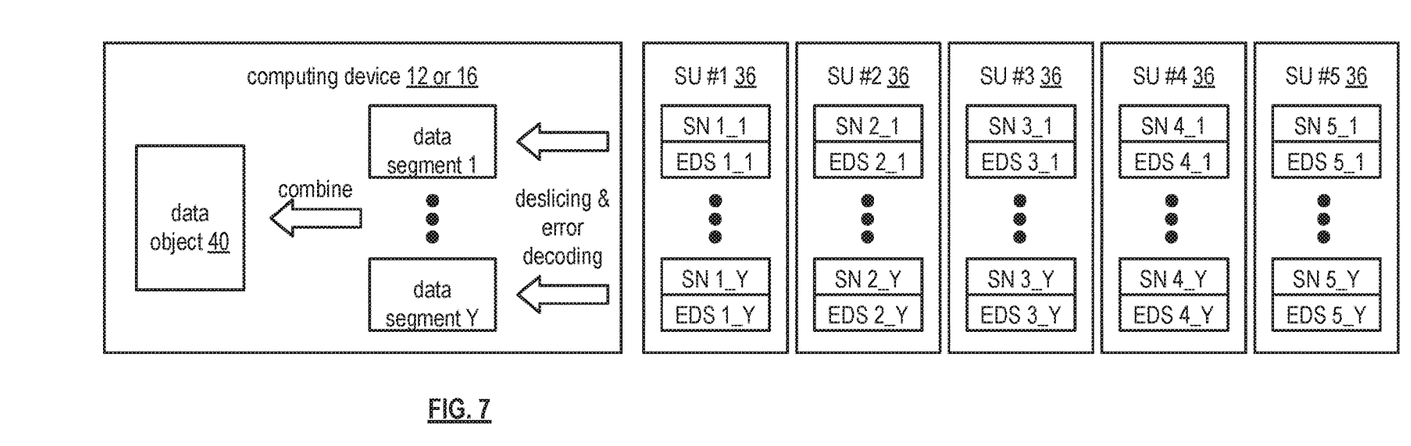
FIG. 7 is a schematic block diagram of an example of dispersed storage error decoding of data in accordance with the present invention.

FIG. 7 is a schematic block diagram of an example of dispersed storage error decoding of a data object that was dispersed storage error encoded and stored in the example of FIG. 4. In this example, the computing device 12 or 16 retrieves from the storage units at least the decode threshold number of encoded data slices per data segment. As a specific example, the computing device retrieves a read threshold number of encoded data slices.

Figure 8:
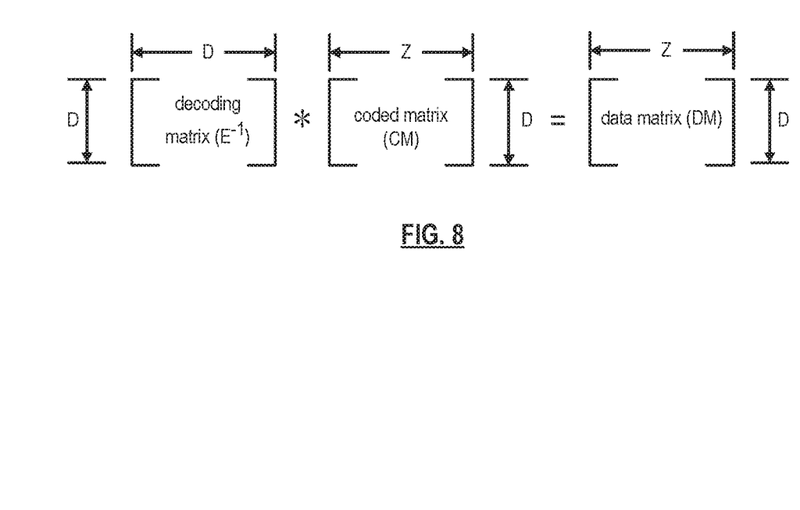
FIG. 8 is a schematic block diagram of a generic example of an error decoding function in accordance with the present invention.

To recover a data segment from a decode threshold number of encoded data slices, the computing device uses a decoding function as shown in FIG. 8. As shown, the decoding function is essentially an inverse of the encoding function of FIG. 4. The coded matrix includes a decode threshold number of rows (e.g., three in this example) and the decoding matrix in an inversion of the encoding matrix that includes the corresponding rows of the coded matrix. For example, if the coded matrix includes rows 1, 2, and 4, the encoding matrix is reduced to rows 1, 2, and 4, and then inverted to produce the decoding matrix.

Figures 9A, 9B, 9C:
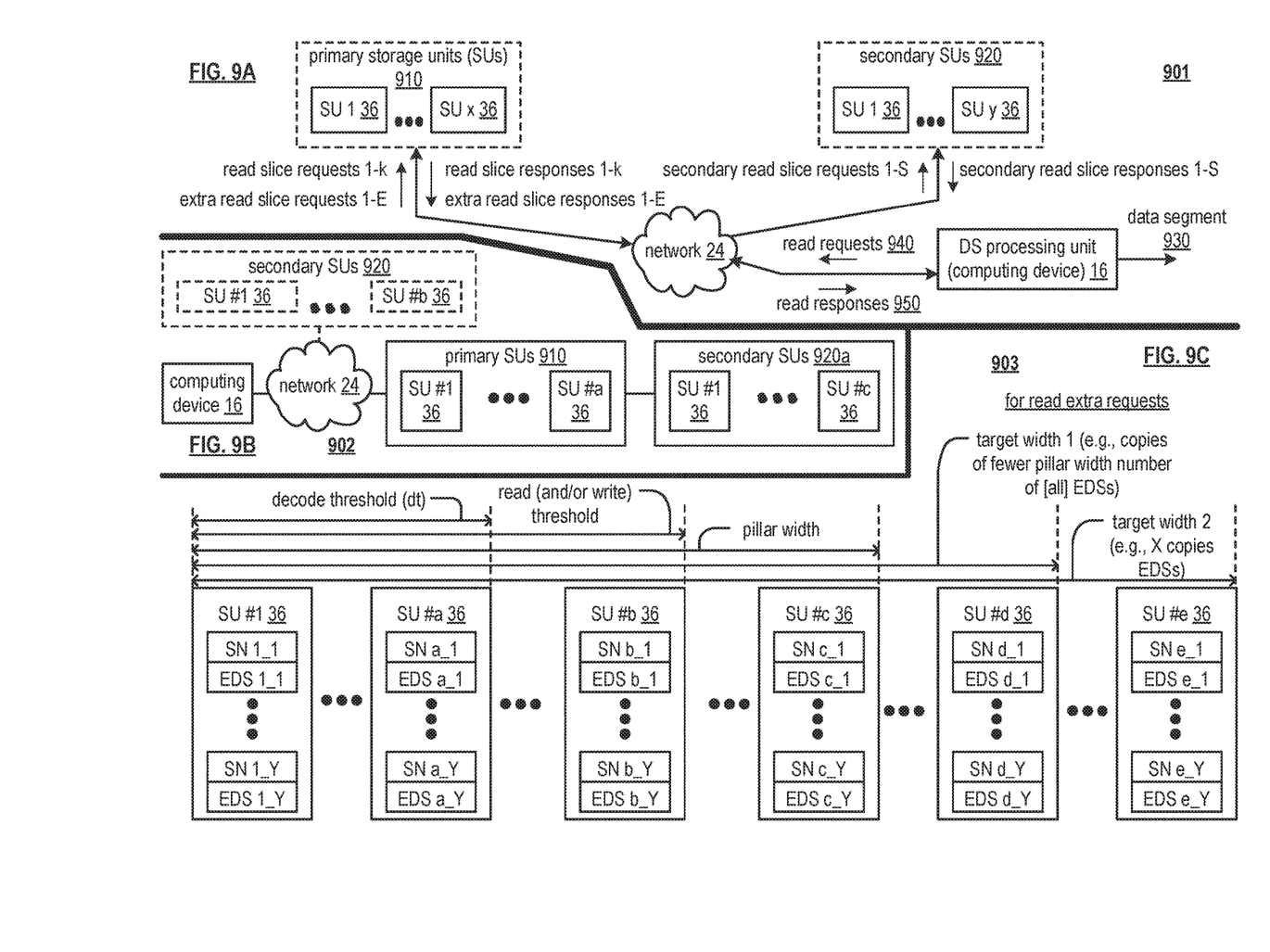
FIG. 9A is a schematic block diagram of another embodiment of a dispersed storage network (DSN) in accordance with the present invention.
FIG. 9B is a schematic block diagram of another embodiment of a dispersed storage network (DSN) in accordance with the present invention.
FIG. 9C is a schematic block diagram of an example of various parameters associated with a set of encoded data slices (EDSs) stored within storage units (SUs) in accordance with the present invention

FIG. 9A is a schematic block diagram of another embodiment 901 of a dispersed storage network (DSN) in accordance with the present invention. This diagram shows a schematic block diagram of another embodiment of a dispersed storage network (DSN) that includes primary storage units (SUs) 910, secondary storage units 920, the network 24 of FIG. 1, and the DSN processing unit (or computing device) 16 of FIG. 1. The primary SUs 910 includes one or more storage units 1-x. The secondary SUs 920 includes one or more storage units 1-y. Each storage unit may be implemented utilizing the DS execution (EX) unit 36 of FIG. 1. The DSN functions to recover stored data from one or more of the primary SUs 910 and the secondary SUs 920.

In an example of operation of the recovering of the store data, the DSN processing unit (or computing device) 16 issues at least a decode threshold number of read slice requests to primary SUs 910 when recovering a data segment, where the data segment is dispersed storage error encoded to produce a set of encoded data slices, where at least an information dispersal algorithm (IDA) and/or dispersed error encoding (DSE) threshold number of encoded data slices of the set of encoded data slices are stored in the primary SUs 910, and where the encoded data slices are stored in the secondary SUs 920 when a storage failure occurs of the at least the IDA and/or DSE threshold number of encoded data slices of the primary SUs 910. For example, the DSN processing unit (or computing device) 16 selects and IDA and/or DSE threshold number of storage units of the primary SUs 910, generates the IDA and/or DSE threshold number of read slice requests 1-k, and sends, via the network 24, the IDA and/or DSE threshold number of read slice requests 1-k to the selected primary SUs 910.

Having issued the read slice requests 1-k to the primary SUs 910, the DSN processing unit (or computing device) 16 determines a number of extra read slice requests to send to the primary SUs 910. The DSN processing unit (or computing device) 16 determines the number of extra read slice requests based on one or more of a predetermination, a previous extra value, an estimated DSN storage reliability level, a DSN performance level, a DSN resource utilization level, a desired DSN performance level, and a desired DSN resource utilization level. For example, the DSN processing unit (or computing device) 16 determines to raise extra value when the DSN storage reliability level is unfavorable. As another example, the DSN processing unit (or computing device) 16 determines to lower the extra value when the DSN resource utilization level is unfavorable.

Having determined the number of extra read slice request, the DSN processing unit (or computing device) 16 issues the number of extra read slice requests to the primary SUs 910. For example, the DSN processing unit (or computing device) 16 selects further storage units of the primary SUs 910, generates the extra number of read slice requests 1-E, and sends, via the network 24, the extra number of extra read slice requests 1-E to the selected for the storage units of the primary SUs 910.

When not receiving at least a decode threshold number of encoded data slices of the set of encoded data slices via read slice responses 1-k and/or extra read slice responses 1-E from the primary SUs 910, the DSN processing unit (or computing device) 16 issues one or more secondary read slice requests 1-S to the secondary SUs 920. When receiving the at least a decode threshold number of encoded data slices via one or more of the read slice responses 1-k, the extra read slice responses 1-E, and secondary read slice responses 1-S, the DSN processing unit (or computing device) 16 dispersed storage error decodes the received encoded data slices to reproduce the data segment.

In an example, the DS processing unit (or computing device) 16 is in communication with a storage set 910 via network 24. The DS processing unit (or computing device) 16 includes an interface configured to interface and communicate with a dispersed storage network (DSN) that includes the storage set 910 (e.g., that may include a number of SUs), memory that stores operational instructions, and a processing module operably coupled to the interface and to the memory, wherein the processing module, when operable within the computing device based on the operational instructions, is configured to perform various functions.

In an example of operation and implementation, the DS processing unit (or computing device) 16 generates a read request for a set of encoded data slices (EDSs) of a data object that is stored within primary storage units (SUs) and secondary SUs within the DSN, wherein the read request includes a read extra request that specifies more than a read threshold number of EDSs from the primary SUs and/or instruction to a SU of the primary SUs to forward the read request to at least one SU of the secondary SUs when a DSN operational characteristic compares unfavorably to an acceptable DSN operational characteristic as determined by the DS processing unit (or computing device) 16.

Note that sets of EDSs of the data object are stored within the primary SUs and the secondary SUs within the DSN. The data object is segmented into data segments, and a data segment of the data segments is dispersed error encoded in accordance with dispersed error encoding parameters to produce the set of EDSs that is of pillar width. The decode threshold number of EDSs are needed to recover the data segment, the read threshold number of EDSs provides for reconstruction of the data segment, and a write threshold number of EDSs provides for a successful transfer of the set of EDSs from a first at least one location in the DSN to a second at least one location in the DSN.

The DS processing unit (or computing device) 16 then transmits the read request for the set of EDSs of the data object to the primary SUs within the DSN and receives at least the read threshold number of EDSs from the primary SUs. Also, note that the SU of the primary SUs provides an EDS of the set of EDSs from memory of the SU of the primary SUs when the EDS of the set of EDSs is stored and available within the SU of the primary SUs. In addition, the SU of the primary SUs provides the EDS of the set of EDSs after receipt thereof from a SU of the secondary SUs when at least one of the DSN operational characteristic compares unfavorably to the acceptable DSN operational characteristic as determined by the SU of the primary SUs or the EDS of the set of EDSs is unavailable within the memory of the SU of the primary SUs. In general, both the DS processing unit (or computing device) 16 and at least one SU of the primary SUs include intelligence to determine how, where, and when to provide requested EDSs to a requesting device (e.g., to the DS processing unit (or computing device) 16). In an example, each SU of the primary SUs included intelligence to determine whether to forward a read request to at least one SU of the secondary SUs. In addition, the DS processing unit (or computing device) 16 itself may also include intelligence to provide suggestion, recommendation, instruction, and/or other information to at least one SU of the primary SUs to direct the operation of the at least one SU of the primary SUs.

In some examples, the DS processing unit (or computing device) 16 operates to identify the primary SUs among a plurality of overall SUs of the DSN based on an affinity of the primary SUs that specifies an estimated likelihood that the set of EDSs are stored within the primary SUs. In other examples, the DS processing unit (or computing device) 16 operates to generate the read request for the set of EDSs of the data object to specify instruction for the SU of the primary SUs to generate another read extra request that specifies the more than the read threshold number of EDSs based on the read request forwarded from the SU of the primary SUs and to transmit the another read extra request to the at least one SU of the secondary SUs.

In even other examples, the DS processing unit (or computing device) 16 operates to generate the read request for the set of EDSs of the data object that is stored within the primary SUs and the secondary SUs within the DSN, wherein the read request specifies no more than the read threshold number of EDSs when the DSN operational characteristic compares favorably to the acceptable DSN operational characteristic as determined by the computing device and receive the read threshold number of EDSs from the primary SUs in response to the primary SUs.

In some other examples, the DS processing unit (or computing device) 16 operates to instruct at least one SU of the primary SUs to generate at least one redundant EDS based on at least one EDS of the set of EDSs and to transmit the at least one redundant EDS to the at least one SU of the secondary SUs for storage therein when the DSN operational characteristic compares unfavorably to the acceptable DSN operational characteristic as determined by the computing device. In even other examples, the DS processing unit (or computing device) 16 operates to instruct at least one SU of the primary SUs to generate a copy of the set of EDSs and to transmit the copy of the set of EDSs to the secondary SUs for storage therein when the DSN operational characteristic compares unfavorably to the acceptable DSN operational characteristic as determined by the computing device.

Note that is some examples the read extra request specifies a first number of EDSs that is more than the read threshold number of EDSs from the primary SUs when the DSN operational characteristic compares unfavorably to the acceptable DSN operational characteristic as determined by the computing device within a first unfavorable comparison range. Also, the read extra request may also specify a second number of EDSs that is more than the read threshold number of EDSs from the primary SUs when the DSN operational characteristic compares unfavorably to the acceptable DSN operational characteristic as determined by the computing device within a second unfavorable comparison range.

Note that the DS processing unit (or computing device) 16 may be located at a first premises that is remotely located from at least one SU of the primary SUs or plurality of secondary SUs the within the DSN. Also, note that the DS processing unit (or computing device) 16 may be of any of a variety of types of devices as described herein and/or their equivalents including a SU of the primary SUs or the secondary SUs within the DSN, a wireless smart phone, a laptop, a tablet, a personal computers (PC), a work station, and/or a video game device. Note also that the DSN may be implemented to include or be based on any of a number of different types of communication systems including a wireless communication system, a wire lined communication systems, a non-public intranet system, a public internet system, a local area network (LAN), and/or a wide area network (WAN).

FIG. 9B is a schematic block diagram of another embodiment 902 of a dispersed storage network (DSN) in accordance with the present invention. This diagram shows a different configuration by which a DS processing unit (or computing device) 16 is in communication with primary SUs 910 and secondary SUs 920a (and optionally also secondary SUs 920). For example, the secondary SUs 920a are shown as being directly connected and/or coupled to the primary SUs 910 without needing to go through the network 24. Note that the optionally included secondary SUs 920 may also be in communication with the primary SUs 910 via the network 24.

In general, any of a variety of configurations may be used that include primary SUs and secondary SUs. The primary SUs and the secondary SUs may be viewed as being different respective layers of SUs in the DSN from certain perspectives. For example, the primary SUs may be configured to access the secondary SUs and selectively retrieve EDSs there from based on processing, decision-making, and intelligence included within the primary SUs. In addition, the primary SUs may be configured to operate cooperatively with the DS processing unit (or computing device) 16 to determine how to provide EDSs to the DS processing unit (or computing device) 16.

FIG. 9C is a schematic block diagram of an example 903 of various parameters associated with a set of encoded data slices (EDSs) stored within storage units (SUs) in accordance with the present invention. This diagram shows generally the relationship between a pillar width number of SUs (and/or EDSs), a decode threshold number of SUs (and/or EDSs), a read threshold number of SUs (and/or EDSs), and a write threshold number of SUs (and/or EDSs). When considering such numbers with respect to EDSs, note that a data object is segmented into data segments, and a data segment of the plurality of data segments is dispersed error encoded in accordance with dispersed error encoding parameters to produce the set of EDSs that is of pillar width. A decode threshold number of EDSs are needed to recover the data segment, a read threshold number of EDSs provides for reconstruction of the data segment, and a write threshold number of EDSs provides for a successful transfer of the set of EDSs from a first at least one location in the DSN to a second at least one location in the DSN. Note also that the read threshold number and the write threshold number may be the same in certain examples and based on certain dispersed error encoding parameters. In general, the read threshold number is greater than the decode threshold number. Also, the write threshold number is generally greater than the read threshold number and less than the pillar width.

A target width that is greater than the pillar width may be used to generate redundant copies of the EDSs. In one example, a target width 1 corresponds to generating redundant copies of EDSs that is fewer than the pillar width of EDSs. For example, copies of a subset of the EDSs within the pillar width number of EDSs are made for use to service the DSN. Alternatively, a target width 2 corresponds to generating an integer multiple number of redundant copies of those EDSs that are within the pillar width of EDSs (e.g., one redundant copy of those EDSs, two redundant copies of those EDSs, three two redundant copies of those EDSs, etc.). Note also that any desired values of target width may be adapted, modified, adjusted, etc. to be any of the various numbers as described with respect to this diagram at different times and based on different considerations.

Any desired example of additional EDSs may be generated and stored within primary SUs and/or secondary SUs. As desired, any particular configuration of redundant and/or additional EDSs may be generated and stored within these primary SUs and/or secondary SUs. In some examples, there may be one or more EDSs of the set of EDSs that is not stored in any SU of the primary SUs, but that EDS or a copy of that EDS will be stored in at least one SU of the secondary SUs. In general, the primary SUs and secondary SUs store EDSs so that a combination of EDSs retrieved there from may be provided to a requesting device (e.g., a DS processing unit (or computing device) 16) via at least one SU of the primary SUs. In some examples, a SU of the primary SUs receives at least one EDS from at least one SU of the secondary SUs and provided it/forwards it to the requesting device (e.g., a DS processing unit (or computing device) 16).

Figure 10A:
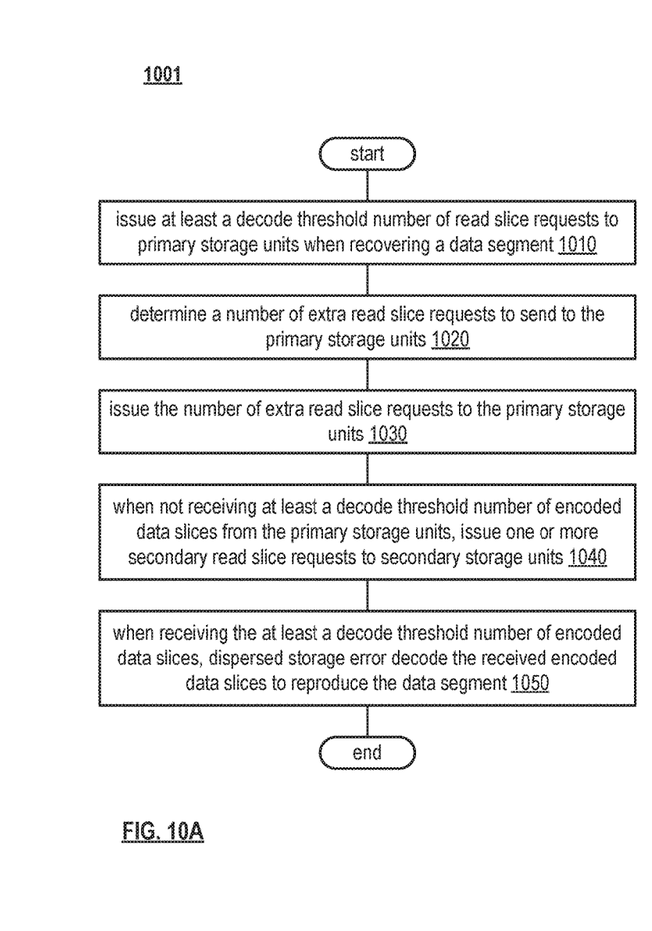
FIG. 10A is a diagram illustrating an embodiment of a method for execution by one or more computing devices in accordance with the present invention.

FIG. 10A is a diagram illustrating an embodiment of a method 1001 for execution by one or more computing devices in accordance with the present invention. This diagram shows a flowchart illustrating an example of recovering data. The method begins or continues at a step 1010 where a processing module of a distributed storage and task (DS) processing unit issues at least a decode threshold number of read slice requests to the primary SUs when recovering a data segment. For example, the processing module selects an information dispersal algorithm (IDA) threshold number of SUs of the primary SUs, generates an IDA and/or DSE threshold number of read slice requests, and sends the IDA and/or DSE threshold number of read slice requests to the selected primary SUs. As another example, the processing module sends a read threshold number of read slice requests, where the read threshold number is greater than the IDA and/or DSE threshold number.

The method continues at a step 1020 where the processing module determines a number of extra read slice requests to send to the primary SUs. The processing module determines the number of extra read slice requests based on one or more of a predetermination, a previous extra value, a dispersed storage network (DSN) estimated storage reliability level, a DSN performance level, a DSN resource utilization level, a desired DSN performance level, and a desired DSN resource utilization level.

The method continues at a step 1030 where the processing module issues the number of actual read slice requests to the primary SUs. The issuing includes selecting further SUs of the primary SUs, generating the extra number of read slice requests, and sending the extra number of extra read slice requests to the selected further SUs of the primary SUs.

When not receiving at least a decode threshold number of encoded data slices from the primary SUs, the method continues at a step 1040 where the processing module issues one or more secondary read slice requests to the secondary SUs. For example, the processing module determines a number of secondary read slice requests based on a number of required encoded data slices to achieve the decode threshold number of encoded data slices, generates the one or more secondary read slice requests, and sends the secondary read slice requests to the corresponding secondary SUs. When receiving the at least a decode threshold number of encoded data slices, the method continues at a step 1050 where the processing module dispersed storage error decodes the received encoded data slices to reproduce the data segment.

Figure 10B:
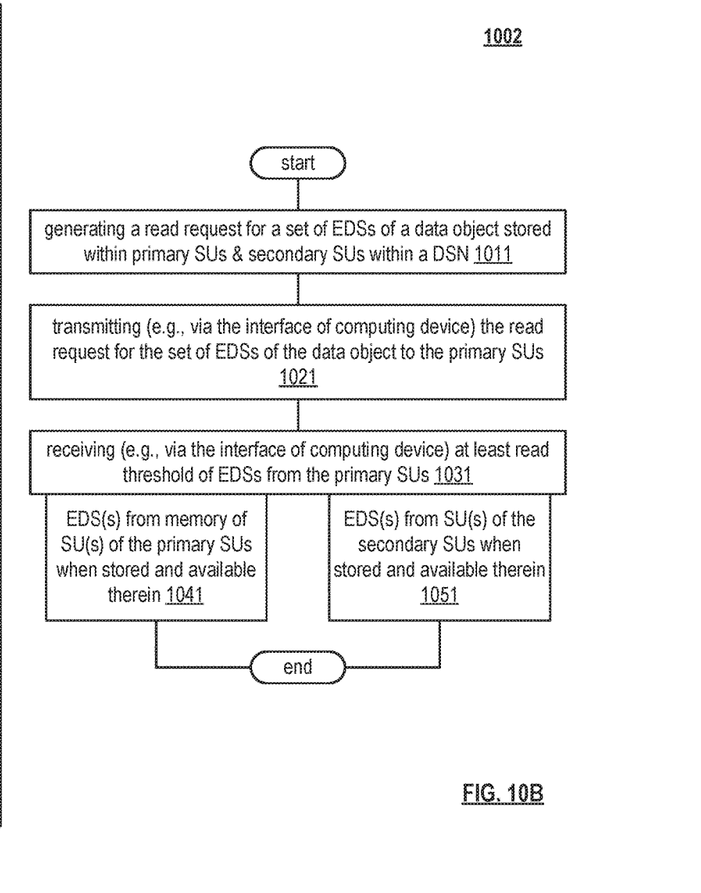
FIG. 10B is a diagram illustrating another embodiment of a method for execution by one or more computing devices in accordance with the present invention.

FIG. 10B is a diagram illustrating another embodiment of a method 1002 for execution by one or more computing devices in accordance with the present invention. The method 1002 operates in step 1011 by generating a read request for a set of encoded data slices (EDSs) of a data object that is stored within primary storage units (SUs) and secondary SUs within a dispersed storage network (DSN). Note that the read request includes a read extra request that specifies more than a read threshold number of EDSs from the primary SUs and/or instruction to a SU of the primary SUs to forward the read request to at least one SU of the secondary SUs when a DSN operational characteristic compares unfavorably to an acceptable DSN operational characteristic as determined by the computing device. Also, note that sets of EDSs of the data object are stored within the primary SUs and the secondary SUs within the DSN. The data object is segmented into data segments, and a data segment of the data segments is dispersed error encoded in accordance with dispersed error encoding parameters to produce the set of EDSs that is of pillar width. Also, a decode threshold number of EDSs are needed to recover the data segment, the read threshold number of EDSs provides for reconstruction of the data segment, and a write threshold number of EDSs provides for a successful transfer of the set of EDSs from a first at least one location in the DSN to a second at least one location in the DSN.

The method 1002 then operates in step 1021 by transmitting (e.g., via an interface of the computing device configured to interface and communicate with the DSN) the read request for the set of EDSs of the data object to the primary SUs within the DSN. The method 1002 then operates in step 1031 by receiving (e.g., via the interface of the computing device configured to interface and communicate with the DSN) at least the read threshold number of EDSs from the primary SUs.

In some examples, the SU of the primary SUs provides an EDS of the set of EDSs from memory of the SU of the primary SUs when the EDS of the set of EDSs is stored and available within the SU of the primary SUs as shown in step 1041. In addition, the SU of the primary SUs provides the EDS of the set of EDSs after receipt thereof from a SU of the secondary SUs when at least one of the DSN operational characteristic compares unfavorably to the acceptable DSN operational characteristic as determined by the SU of the primary SUs or the EDS of the set of EDSs is unavailable within the memory of the SU of the primary SUs as shown in step 1051.

This disclosure presents various embodiments, examples, etc. that may be used to provide for determining a read strategy to receive at least a decode threshold and/or at least a read threshold number of EDSs to reconstruct a data segment. For example, with respect to a DSN in which trimmed writes (e.g., write operations that operates based on fewer than a write threshold number of EDSs) or target width systems (e.g., including those that may include target widths greater than the pillar width such as with respect to FIG. 9C) may operate using a concept of affinity. This concept of affinity may be described as referring to those SUs having some primary SUs that be more likely to contain EDSs that are being requested than other secondary SUs.

For example, there may be different strategies for reading data from the DSN efficiently. Examples of such strategies may result in different numbers of EDSs being returned, depending on the state of the DSN at the time the data was written, etc. In a first example strategy, the DS processing unit issues at least a threshold (e.g., a decode threshold and/or read threshold) number of reads to a subset of the primary SUs, and then issues reads to all the secondary SUs. In the case that EDSs are properly stored only on the primary SUs, this strategy returns only as many EDSs as the number of reads issued to the primary locations (for when all EDSs are at the proper locations, every primary SU has an EDS and no secondary SU has an EDS). For each primary SU does not have an EDS, there will be a corresponding secondary SU that does hold an EDS. Therefore, when EDSs are not at their proper locations, the above strategy can result in many more EDSs being returned than expected. An alternate strategy is to use "Read Extra" to send some number of read requests to the primary SUs plus some extra number, also sent to the other primary SUs. This is more likely to return extra EDSs when things are healthy (at their proper locations) but can have a lower worst☐case upper bound for the number of EDSs returned. The DS processing unit, may alternate between these strategies based on recent experience of the number of extra EDSs being returned. Depending on how healthy the system is, one strategy may be preferable compared to the other in that it returns less EDSs and uses less network IO.

It is noted that terminologies as may be used herein such as bit stream, stream, signal sequence, etc. (or their equivalents) have been used interchangeably to describe digital information whose content corresponds to any of a number of desired types (e.g., data, video, speech, audio, etc. any of which may generally be referred to as 'data').

As may be used herein, the terms "substantially" and "approximately" provides an industry-accepted tolerance for its corresponding term and/or relativity between items. Such an industry-accepted tolerance ranges from less than one percent to fifty percent and corresponds to, but is not limited to, component values, integrated circuit process variations, temperature variations, rise and fall times, and/or thermal noise. Such relativity between items ranges from a difference of a few percent to magnitude differences. As may also be used herein, the term(s) "configured to", "operably coupled to", "coupled to", and/or "coupling" includes direct coupling between items and/or indirect coupling between items via an intervening item (e.g., an item includes, but is not limited to, a component, an element, a circuit, and/or a module) where, for an example of indirect coupling, the intervening item does not modify the information of a signal but may adjust its current level, voltage level, and/or power level. As may further be used herein, inferred coupling (i.e., where one element is coupled to another element by inference) includes direct and indirect coupling between two items in the same manner as "coupled to". As may even further be used herein, the term "configured to", "operable to", "coupled to", or "operably coupled to" indicates that an item includes one or more of power connections, input(s), output(s), etc., to perform, when activated, one or more its corresponding functions and may further include inferred coupling to one or more other items. As may still further be used herein, the term "associated with", includes direct and/or indirect coupling of separate items and/or one item being embedded within another item.

As may be used herein, the term "compares favorably", indicates that a comparison between two or more items, signals, etc., provides a desired relationship. For example, when the desired relationship is that signal 1 has a greater magnitude than signal 2, a favorable comparison may be achieved when the magnitude of signal 1 is greater than that of signal 2 or when the magnitude of signal 2 is less than that of signal 1. As may be used herein, the term "compares unfavorably", indicates that a comparison between two or more items, signals, etc., fails to provide the desired relationship.

As may also be used herein, the terms "processing module", "processing circuit", "processor", and/or "processing unit" may be a single processing device or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on hard coding of the circuitry and/or operational instructions. The processing module, module, processing circuit, and/or processing unit may be, or further include, memory and/or an integrated memory element, which may be a single memory device, a plurality of memory devices, and/or embedded circuitry of another processing module, module, processing circuit, and/or processing unit. Such a memory device may be a read-only memory, random access memory, volatile memory, non-volatile memory, static memory, dynamic memory, flash memory, cache memory, and/or any device that stores digital information. Note that if the processing module, module, processing circuit, and/or processing unit includes more than one processing device, the processing devices may be centrally located (e.g., directly coupled together via a wired and/or wireless bus structure) or may be distributedly located (e.g., cloud computing via indirect coupling via a local area network and/or a wide area network). Further note that if the processing module, module, processing circuit, and/or processing unit implements one or more of its functions via a state machine, analog circuitry, digital circuitry, and/or logic circuitry, the memory and/or memory element storing the corresponding operational instructions may be embedded within, or external to, the circuitry comprising the state machine, analog circuitry, digital circuitry, and/or logic circuitry. Still further note that, the memory element may store, and the processing module, module, processing circuit, and/or processing unit executes, hard coded and/or operational instructions corresponding to at least some of the steps and/or functions illustrated in one or more of the figures. Such a memory device or memory element can be included in an article of manufacture.

One or more embodiments have been described above with the aid of method steps illustrating the performance of specified functions and relationships thereof. The boundaries and sequence of these functional building blocks and method steps have been arbitrarily defined herein for convenience of description. Alternate boundaries and sequences can be defined so long as the specified functions and relationships are appropriately performed. Any such alternate boundaries or sequences are thus within the scope and spirit of the claims. Further, the boundaries of these functional building blocks have been arbitrarily defined for convenience of description. Alternate boundaries could be defined as long as the certain significant functions are appropriately performed. Similarly, flow diagram blocks may also have been arbitrarily defined herein to illustrate certain significant functionality.

To the extent used, the flow diagram block boundaries and sequence could have been defined otherwise and still perform the certain significant functionality. Such alternate definitions of both functional building blocks and flow diagram blocks and sequences are thus within the scope and spirit of the claims. One of average skill in the art will also recognize that the functional building blocks, and other illustrative blocks, modules and components herein, can be implemented as illustrated or by discrete components, application specific integrated circuits, processors executing appropriate software and the like or any combination thereof.

In addition, a flow diagram may include a "start" and/or "continue" indication. The "start" and "continue" indications reflect that the steps presented can optionally be incorporated in or otherwise used in conjunction with other routines. In this context, "start" indicates the beginning of the first step presented and may be preceded by other activities not specifically shown. Further, the "continue" indication reflects that the steps presented may be performed multiple times and/or may be succeeded by other activities not specifically shown. Further, while a flow diagram indicates a particular ordering of steps, other orderings are likewise possible provided that the principles of causality are maintained.

The one or more embodiments are used herein to illustrate one or more aspects, one or more features, one or more concepts, and/or one or more examples. A physical embodiment of an apparatus, an article of manufacture, a machine, and/or of a process may include one or more of the aspects, features, concepts, examples, etc. described with reference to one or more of the embodiments discussed herein. Further, from figure to figure, the embodiments may incorporate the same or similarly named functions, steps, modules, etc. that may use the same or different reference numbers and, as such, the functions, steps, modules, etc. may be the same or similar functions, steps, modules, etc. or different ones.

Unless specifically stated to the contra, signals to, from, and/or between elements in a figure of any of the figures presented herein may be analog or digital, continuous time or discrete time, and single-ended or differential. For instance, if a signal path is shown as a single-ended path, it also represents a differential signal path. Similarly, if a signal path is shown as a differential path, it also represents a single-ended signal path. While one or more particular architectures are described herein, other architectures can likewise be implemented that use one or more data buses not expressly shown, direct connectivity between elements, and/or indirect coupling between other elements as recognized by one of average skill in the art.

The term "module" is used in the description of one or more of the embodiments. A module implements one or more functions via a device such as a processor or other processing device or other hardware that may include or operate in association with a memory that stores operational instructions. A module may operate independently and/or in conjunction with software and/or firmware. As also used herein, a module may contain one or more sub-modules, each of which may be one or more modules.

As may further be used herein, a computer readable memory includes one or more memory elements. A memory element may be a separate memory device, multiple memory devices, or a set of memory locations within a memory device. Such a memory device may be a read-only memory, random access memory, volatile memory, non-volatile memory, static memory, dynamic memory, flash memory, cache memory, and/or any device that stores digital information. The memory device may be in a form a solid state memory, a hard drive memory, cloud memory, thumb drive, server memory, computing device memory, and/or other physical medium for storing digital information.

While particular combinations of various functions and features of the one or more embodiments have been expressly described herein, other combinations of these features and functions are likewise possible. The present disclosure is not limited by the particular examples disclosed herein and expressly incorporates these other combinations.

What is claimed is:

1. A computing device comprising:
an interface configured to interface and communicate with a dispersed storage network (DSN);
memory that stores operational instructions; and
a processing module operably coupled to the interface and to the memory, wherein the processing module, when operable within the computing device based on the operational instructions, is configured to:
generate a read request for a set of encoded data slices (EDSs) of a data object that is distributedly stored within a plurality of primary storage units (SUs) and a plurality of secondary SUs within the DSN, wherein the read request includes a read extra request that specifies at least one of more than a read threshold number of EDSs from the plurality of primary SUs or instruction to a SU of the plurality of primary SUs to forward the read request to at least one SU of the plurality of secondary SUs when a DSN operational characteristic compares unfavorably to an acceptable DSN operational characteristic as determined by the computing device, wherein sets of EDSs of the data object are distributedly stored within the plurality of primary SUs and the plurality of secondary SUs within the DSN, wherein the data object is segmented into a plurality of data segments, wherein a data segment of the plurality of data segments is dispersed error encoded in accordance with dispersed error encoding parameters to produce the set of EDSs that is of pillar width, wherein a decode threshold number of EDSs are needed to recover the data segment, wherein the read threshold number of EDSs provides for reconstruction of the data segment, wherein a write threshold number of EDSs provides for a successful transfer of the set of EDSs from a first at least one location in the DSN to a second at least one location in the DSN;
transmit via the interface and via the DSN the read request for the set of EDSs of the data object to the plurality of primary SUs within the DSN; and
receive via the interface and via the DSN at least the read threshold number of EDSs from the plurality of primary SUs, wherein:
the SU of the plurality of primary SUs provides an EDS of the set of EDSs from memory of the SU of the plurality of primary SUs to the computing device via the DSN and via the interface when the EDS of the set of EDSs is stored and available within the SU of the plurality of primary SUs; and
the SU of the plurality of primary SUs provides the EDS of the set of EDSs to the computing device via the DSN and via the interface after receipt thereof from a SU of the plurality of secondary SUs when at least one of the DSN operational characteristic compares unfavorably to the acceptable DSN operational characteristic as determined by the SU of the plurality of primary SUs or the EDS of the set of EDSs is unavailable within the memory of the SU of the plurality of primary SUs.

2. The computing device of claim 1, wherein the processing module, when operable within the computing device based on the operational instructions, is further configured to:
identify the plurality of primary SUs among a plurality of overall SUs of the DSN based on an affinity of the plurality of primary SUs that specifies an estimated likelihood that the set of EDSs are stored within the plurality of primary SUs.

3. The computing device of claim 1, wherein the processing module, when operable within the computing device based on the operational instructions, is further configured to:
generate the read request for the set of EDSs of the data object to specify instruction for the SU of the plurality of primary SUs to generate another read extra request that specifies the more than the read threshold number of EDSs based on the read request forwarded from the SU of the plurality of primary SUs and to transmit the another read extra request to the at least one SU of the plurality of secondary SUs.

4. The computing device of claim 1, wherein the processing module, when operable within the computing device based on the operational instructions, is further configured to:
generate the read request for the set of EDSs of the data object that is stored within the plurality of primary SUs and the plurality of secondary SUs within the DSN, wherein the read request specifies no more than the read threshold number of EDSs when the DSN operational characteristic compares favorably to the acceptable DSN operational characteristic as determined by the computing device; and
receive the read threshold number of EDSs from the plurality of primary SUs in response to the plurality of primary SUs.

5. The computing device of claim 1, wherein the processing module, when operable within the computing device based on the operational instructions, is further configured to:
instruct at least one SU of the plurality of primary SUs to generate at least one redundant EDS based on at least one EDS of the set of EDSs and to transmit the at least one redundant EDS to the at least one SU of the plurality of secondary SUs for storage therein when the DSN operational characteristic compares unfavorably to the acceptable DSN operational characteristic as determined by the computing device.

6. The computing device of claim 1, wherein the processing module, when operable within the computing device based on the operational instructions, is further configured to:
instruct at least one SU of the plurality of primary SUs to generate a copy of the set of EDSs and to transmit the copy of the set of EDSs to the plurality of secondary SUs for storage therein when the DSN operational characteristic compares unfavorably to the acceptable DSN operational characteristic as determined by the computing device.

7. The computing device of claim 1, wherein:
the read extra request specifies a first number of EDSs that is more than the read threshold number of EDSs from the plurality of primary SUs when the DSN operational characteristic compares unfavorably to the acceptable DSN operational characteristic as determined by the computing device within a first unfavorable comparison range; and
the read extra request specifies a second number of EDSs that is more than the read threshold number of EDSs from the plurality of primary SUs when the DSN operational characteristic compares unfavorably to the acceptable DSN operational characteristic as determined by the computing device within a second unfavorable comparison range.

8. The computing device of claim 1, wherein the computing device is located at a first premises that is remotely located from at least one SU of the plurality of primary SUs or plurality of secondary SUs the within the DSN.

9. The computing device of claim 1 further comprising:
a SU of the plurality of primary SUs or the plurality of secondary SUs within the DSN, a wireless smart phone, a laptop, a tablet, a personal computers (PC), a work station, or a video game device.

10. The computing device of claim 1, wherein the DSN includes at least one of a wireless communication system, a wire lined communication system, a non-public intranet system, a public internet system, a local area network (LAN), or a wide area network (WAN).

11. A method for execution by a computing device, the method comprising:
generating a read request for a set of encoded data slices (EDSs) of a data object that is distributedly stored within a plurality of primary storage units (SUs) and a plurality of secondary SUs within a dispersed storage network (DSN), wherein the read request includes a read extra request that specifies at least one of more than a read threshold number of EDSs from the plurality of primary SUs or instruction to a SU of the plurality of primary SUs to forward the read request to at least one SU of the plurality of secondary SUs when a DSN operational characteristic compares unfavorably to an acceptable DSN operational characteristic as determined by the computing device, wherein sets of EDSs of the data object are distributedly stored within the plurality of primary SUs and the plurality of secondary SUs within the DSN, wherein the data object is segmented into a plurality of data segments, wherein a data segment of the plurality of data segments is dispersed error encoded in accordance with dispersed error encoding parameters to produce the set of EDSs that is of pillar width, wherein a decode threshold number of EDSs are needed to recover the data segment, wherein the read threshold number of EDSs provides for reconstruction of the data segment, wherein a write threshold number of EDSs provides for a successful transfer of the set of EDSs from a first at least one location in the DSN to a second at least one location in the DSN;
transmitting, via an interface of the computing device configured to interface and communicate with the DSN and via the DSN, the read request for the set of EDSs of the data object to the plurality of primary SUs within the DSN; and
receiving, via the interface of the computing device configured to interface and communicate with the DSN and via the DSN, at least the read threshold number of EDSs from the plurality of primary SUs, wherein:
the SU of the plurality of primary SUs provides an EDS of the set of EDSs from memory of the SU of the plurality of primary SUs to the computing device via the DSN and via the interface when the EDS of the set of EDSs is stored and available within the SU of the plurality of primary SUs; and
the SU of the plurality of primary SUs provides the EDS of the set of EDSs to the computing device via the DSN and via the interface after receipt thereof from a SU of the plurality of secondary SUs when at least one of the DSN operational characteristic compares unfavorably to the acceptable DSN operational characteristic as determined by the SU of the plurality of primary SUs or the EDS of the set of EDSs is unavailable within the memory of the SU of the plurality of primary SUs.

12. The method of claim 11 further comprising:
identifying the plurality of primary SUs among a plurality of overall SUs of the DSN based on an affinity of the plurality of primary SUs that specifies an estimated likelihood that the set of EDSs are stored within the plurality of primary SUs.

13. The method of claim 11 further comprising:
generating the read request for the set of EDSs of the data object to specify instruction for the SU of the plurality of primary SUs to generate another read extra request that specifies the more than the read threshold number of EDSs based on the read request forwarded from the SU of the plurality of primary SUs and to transmit the another read extra request to the at least one SU of the plurality of secondary SUs.

14. The method of claim 11 further comprising:
generating the read request for the set of EDSs of the data object that is stored within the plurality of primary SUs and the plurality of secondary SUs within the DSN, wherein the read request specifies no more than the read threshold number of EDSs when the DSN operational characteristic compares favorably to the acceptable DSN operational characteristic as determined by the computing device; and
receiving, via the interface of the computing device configured to interface and communicate with the DSN, the read threshold number of EDSs from the plurality of primary SUs in response to the plurality of primary SUs.

15. The method of claim 11 further comprising:
instructing at least one SU of the plurality of primary SUs to generate at least one redundant EDS based on at least one EDS of the set of EDSs and to transmit the at least one redundant EDS to the at least one SU of the plurality of secondary SUs for storage therein when the DSN operational characteristic compares unfavorably to the acceptable DSN operational characteristic as determined by the computing device.

16. The method of claim 11 further comprising:
instructing at least one SU of the plurality of primary SUs to generate a copy of the set of EDSs and to transmit the copy of the set of EDSs to the plurality of secondary SUs for storage therein when the DSN operational characteristic compares unfavorably to the acceptable DSN operational characteristic as determined by the computing device.

17. The method of claim 11, wherein:
the read extra request specifies a first number of EDSs that is more than the read threshold number of EDSs from the plurality of primary SUs when the DSN operational characteristic compares unfavorably to the acceptable DSN operational characteristic as determined by the computing device within a first unfavorable comparison range; and
the read extra request specifies a second number of EDSs that is more than the read threshold number of EDSs from the plurality of primary SUs when the DSN operational characteristic compares unfavorably to the acceptable DSN operational characteristic as determined by the computing device within a second unfavorable comparison range.

18. The method of claim 11, wherein the computing device is located at a first premises that is remotely located from at least one SU of the plurality of primary SUs of the plurality of secondary SUs within the DSN.

19. The method of claim 11, wherein the computing device is a SU of the plurality of primary SUs of the plurality of secondary SUs within the DSN, a wireless smart phone, a laptop, a tablet, a personal computers (PC), a work station, or a video game device.

20. The method of claim 11, wherein the DSN includes at least one of a wireless communication system, a wire lined communication system, a non-public intranet system, a public internet system, a local area network (LAN), or a wide area network (WAN).

* * * * *